United States Patent [19]

Piccone et al.

[11] 4,084,207
[45] Apr. 11, 1978

[54] ADJUSTABLE OVERVOLTAGE PROTECTED CIRCUIT FOR HIGH POWER THYRISTORS

[75] Inventors: Dante Edmond Piccone, Glenmoore; Istvan Somos, Lansdowne, both of Pa.

[73] Assignee: General Electric Company, Philadelphia, Pa.

[21] Appl. No.: 725,619

[22] Filed: Sep. 22, 1976

[51] Int. Cl.² .............................................. H02H 3/20
[52] U.S. Cl. ...................................... 361/91; 361/56; 363/54; 363/57
[58] Field of Search .......................... 361/56, 91, 100; 321/11, 12, 13, 14, 27 R; 307/252 L; 363/50, 53, 54, 57

[56] References Cited
U.S. PATENT DOCUMENTS

| | | | |
|---|---|---|---|
| 3,416,002 | 12/1968 | Faust | 321/11 X |
| 3,487,261 | 12/1969 | Boksjo et al. | 321/11 X |
| 3,662,250 | 5/1972 | Piccone et al. | 321/11 |
| 3,886,432 | 5/1975 | Piccone et al. | 321/11 |
| 3,904,931 | 9/1975 | Leidich | 361/56 |
| 3,947,726 | 3/1976 | Dececco et al. | 361/56 |

*Primary Examiner*—Patrick R. Salce
*Attorney, Agent, or Firm*—William Freedman; Carl L. Silverman

[57] ABSTRACT

An overvoltage responsive triggering circuit for a main high power thyristor comprises a plurality of n auxiliary thyristors and electric energy storing means connected in series across said main thyristor. The auxiliary thyristors are poled to conduct forward current in the same direction as said main thyristor and have an aggregate forward breakdown voltage greater than a predetermined threshold magnitude. Said threshold magnitude is greater than the aggregate forward voltage of said n auxiliary thyristors minus the forward breakdown voltage of one of said auxiliary thyristors. Between the anode and another electrode of said one auxiliary thyristor there is connected secondary voltage breakdown means having a blocking voltage less than the forward breakdown voltage of said one auxiliary thyristor, whereby said triggering circuit becomes conductive in the breakdown mode at said threshold voltage magnitude.

14 Claims, 6 Drawing Figures

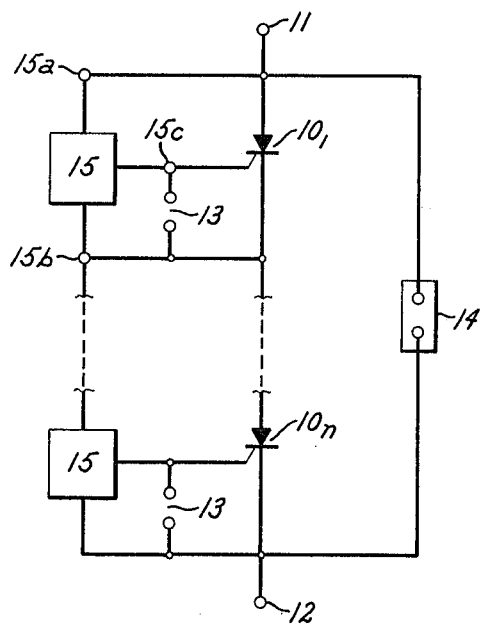
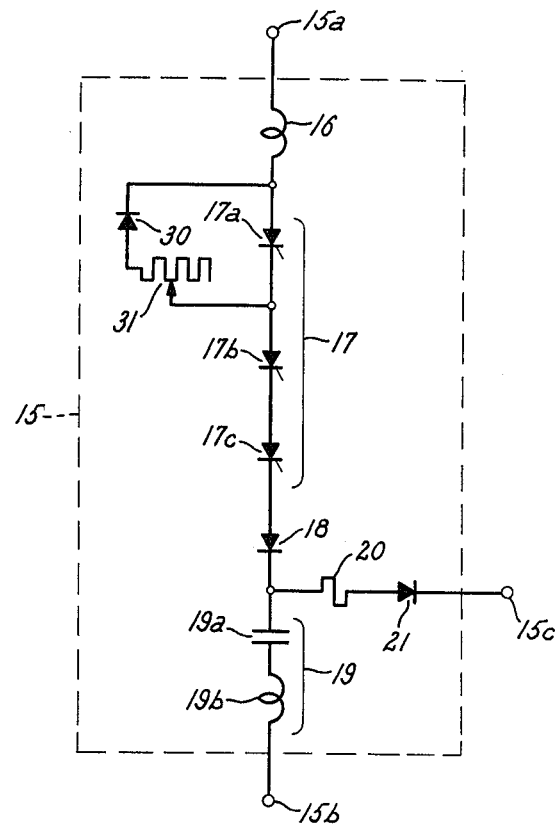
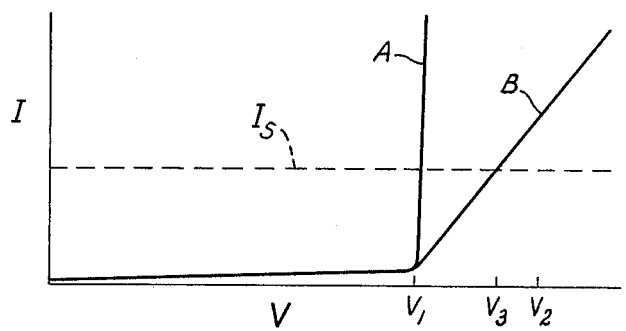
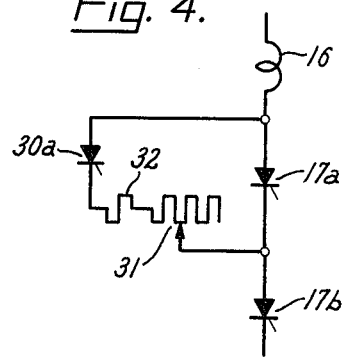
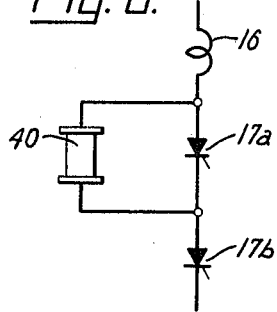
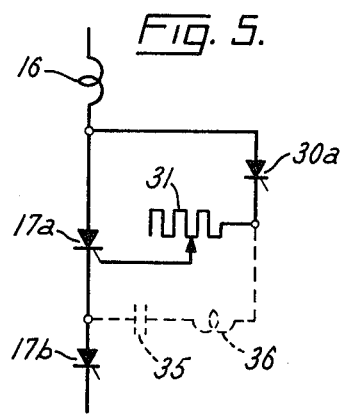

ADJUSTABLE OVERVOLTAGE PROTECTED CIRCUIT FOR HIGH POWER THYRISTORS

BACKGROUND

Our invention relates generally to an electric protective circuit for triggering a relatively high current, high voltage, solid state controlled switching device when a forward bias voltage of predetermined excess magnitude is impressed on the device, and more particularly it relates to improvements in the thyristor overvoltage protective circuit described and claimed in U.S. Pat. No. 3,662,250 granted to Piccone and Somos on May 9, 1972 and assigned to General Electric Company.

"Thyristor" is a generic name for a family of solid state bistable switches, including silicon controlled rectifiers (SCRs), which are physically characterized by a semiconductor wafer having a plurality of layers of alternately P and N type conductivities disposed between a pair of main current carrying metallic electrodes (designated the anode and cathode) and provdided with a control or "gating " electrode. When connected in series with a load impedance and subjected to a forward bias voltage (anode potential positive with respect to the cathode), a thyristor will ordinarily block the flow of load current until triggered or "fired" by the application to its gating electrode of an appropriate control signal, whereupon it abruptly switches from a high resistance blocking state to a very low resistance forward conducting or "on" state. Subsequently the device reverts to its non-conducting (turned off) state in response to through current being reduced below a given holding level.

The forward current and peak blocking voltage ratings of a thyristor are specified by the manufacturer. These ratings determine, under stated conditions and without damaging the thyristor, the maximum load current that the thyristor can conduct when "on" and the maximum applied voltage that it can safely withstand when "off." High current ratings are generally obtained by using relatively large area semiconductor wafers, while high voltage ratings require relatively thick base layers in the wafers. Thus, by way of example, a thyristor having a forward current rating of 1250 amperes average and a repetitive peak forward blocking voltage rating of 2600 volts at an operating junction temperature of 70° C may have a wafer whose area is approximately 3.0 square inches and whose thickness is approximately 0.03 inch. For higher voltage applications, a plurality of such thyristors can be interconnected in series and operated in unison to form a solid state controllable electric valve. One such application is in the field of high voltage direct current power transmission where a plurality of such valves are interconnected and arranged to form a high current converter for controlling the flow of fault electric power between DC and AC sections of a high voltage power transmission system.

During those cyclically recurring intervals when the above mentioned converter valve is in an "off" or blocking state, the valve and its associated equipment are prone to being damaged by extra high voltage surges that may be produced by a variety of different transient phenomena, such, for example, as lightning strokes, bushing flashovers or inverter commutation failures. Lightning arrestors are commonly used to harmlessly divert and suppress overvoltage transients, but it is believed impractical and unwise to rely solely on such arrestors to protect solid state valves when exposed to abnormal voltage surges in the forward direction. In addition, since the arrestor is usually connected across an entire valve consisting of several semiconductor devices in series, there is no guarantee that each constituent thyristor of the valve will not be individually subject to excessive voltage. If a surge of forward anode voltage on an individual thyristor were to increase to a critical level above rated peak off-state voltage, the thyristor will turn on due to a voltage breakover. This mode of turn on, which can be caused by an avalanche breakdown, a punch through or excessive leakage, is a known phenomenum in the thyristor art. It is also known that the normal $di/dt$ capabilities of conventional high voltage thyristors (e.g., thyristors having peak blocking voltages over 1500 volts) are greatly reduced when turned on in this mode.

In our foregoing prior patent, an improved overvoltage responsive trigger scheme is disclosed for protecting a high power main thyristor from forward voltage breakover. The protective circuit comprises a plurality of lower voltage auxiliary PN-PN semiconductor elements connected between the anode and gate of the main thyristor and a series L-C circuit connected between the gate and the cathode. The auxiliary PN-PN elements are selected to turn on in a voltage breakover mode when the forward bias voltage on the main thyristor attains a predetermined threshold magnitude which is lower than the breakover level of the main thyristor, whereupon the latter is triggered by a sharp gate pulse before the voltage attains a destructively high level.

It is found in practice that the overvoltage protective circuit disclosed in my foregoing patent is limited to those discrete, aggregate voltage breakover levels which can be attained by selected combinations of commercially available auxiliary thyristors. Such auxiliary thyristors are available with voltage breakover ratings spaced-apart in magnitude, so that available series combinations of such thyristors are also characterized by aggregate voltage breakover values spaced apart in steps. Intermediate voltage breakover levels may thus be unattainable in practice, or may be attained only by rearranging the series combination of auxiliary thyristors to include one or more high voltage devices in place of several less expensive low voltage devices. It is desirable to provide means for reducing or increasing the effective series breakover level of a series of auxiliary thyristors in steps smaller than attainable my omitting or adding one thyristor in the series.

SUMMARY

Accordingly, it is a general object of our invention to provide means for attaining, in the series protective circuit of my prior U.S. Pat. No. 3,662,250, an effective series circuit breakover level intermediate the aggregate voltage breakover values defined by adding or subtracting one thyristor in a series circuit of $n$ thyristors.

It is a more specific object of our invention to provide means for attaining, in such a series voltage breakover circuit, an effective voltage breakover level less than the aggregate voltage breakover values of $n$ selected thyristors and greater than the aggregate voltage breakover values of $n - 1$ such thyristors.

It is another object of our invention to provide means for continuously adjusting the effective voltage breakover level of such a series thyristor circuit within the voltage steps defined by adding or subtrating a single thyristor in the series.

In carrying out our invention in one preferred embodiment a main power thyristor, or a group of paralleled main thyristors, having a predetermined forward breakover voltage characteristic is shunted by a protective circuit including a plurality of auxiliary lower rated thyristors connected in series and poled to conduct current in the same direction as the main thyristor. The auxiliary thyristors are selected to have an aggregate series breakover voltage characteristic higher than a predetermined threshold voltage at which it is desired that the series of auxiliary thyristors shall conduct in the breakover mode. To effect such conduction at the desired threshold voltage, the anode and another electrode of one auxiliary thyristor are connected through a secondary voltage breakdown device having a maximum blocking voltage less than that of the one auxiliary thyristor and equal to the difference of the threshold voltage and the aggregate forward blocking voltages of the other auxiliary thyristors. The secondary voltage breakdown device may be a blocking diode reversely poled with respect to the main and auxiliary thyristors, or it may be a secondary thyristor poled to conduct in the same direction as the main and auxiliary thyristors. If the breakdown device is a thyristor it may be connected to provide a gate firing pulse to the associated auxiliary thyristor. Alternatively the one auxiliary thyristor may be shunted by a gap device or by a resistor having a non-linear negative resistance-voltage characteristic.

BRIEF DESCRIPTION OF DRAWING

Our invention will be more fully understood and its various objects and advantages further appreciated by referring now to the accompanying drawing wherein;

FIG. 1 is a schematic circuit diagram of a solid state controllable electric valve comprising a series string of high power thyristors, each including an overvoltage protective circuit shown in block form;

FIG. 2 is a schematic diagram of one of the overvoltage protective circuits shown in block form at FIG. 1 and embodying our invention;

FIG. 3 is a graphical representation of the voltage-current characteristic of the auxiliary voltage breakdown circuit shown at FIG. 2; and FIGS. 4, 5 and 6 are fragmentary schematic circuit diagrams of auxiliary voltage breakdown circuits illustrating other embodiments of our invention.

DETAILED DESCRIPTION OF PREFERRED EMBODIMENTS

Referring now to FIG. 1, a series string of duplicate main thyristors $10_1$ to $10_n$ is shown extending between terminals 11 and 12 to form a high voltage solid state controllable valve suitable for use with other identical valves in an electric power converter for a high voltage direct current power delivery system. Each main thyristor of the valve is a high power semiconductor device having relatively large dimensions, and each is equipped with gating means for triggering the thyristor when energized by a compatible control signal in the presence of forward bias on the main electrodes. Although it could take other forms which are known in the art, the gating means shown symbolically in FIG. 1 is a control electrode responsive to a gate current pulse of suitable polarity, magnitude and duration. Such a control signal is periodically supplied to the thyristor by an external gate drive circuit (not shown) adapted to be connected to a pair of control terminals 13.

The voltage rating of the illustrated valve is a multiple of the voltage capability of its constituent thyristors. The current rating depends on the maximum forward current rating of the individual thyristors, and additional parallel thyristors can be used at each level of the valve if desired. In practice the valve will include other power components such as those disclosed in U.S. Pat. No. 3,423,664— Dewey. To turn the valve on, all of its main thyristors are triggered simultaneously, and when the valve is thus fired it can freely conduct load current in a forward direction until subsequently turned off by line voltage commutation.

At various times during each of its cyclic off, or non-conducting, intervals, the valve shown in FIG. 1 has to withstand high peak voltages normally imposed by the associated power system. In addition a valve in its off state may be subjected to abnormal voltage surges due to transient phenomena such as lightning strokes or bushing flashover. To help prevent damage to the valve due to excessively high reverse or forward blocking voltages, a suitable voltage surge suppressor, such as a lightning arrestor 14, is connected across its terminals 11, 12.

For reasons more fully explained in our prior U.S. Pat. No. 3,662,250, each of the main thyristor levels of the valve is provided with an overvoltage triggering circuit 15 having terminals 15a and 15b connected, respectively, to the anode and cathode of the associated main thyristor and a terminal 15c connected to the gate electrode of the same main thyristor. At FIG. 2 I have shown a schematic circuit diagram of a single overvoltage protective circuit 15 embodying my invention in one form. As there illustrated, the anode and cathode terminals 15a, 15b of the protective circuit 15 are interconnected through a series circuit comprising an inductor 16, an overvoltage sensing means 17 including a plurality of relatively low power auxiliary thyristors 17a, 17b, 17c, a diode 18 and energy storing means 19 comprising a capacitor 19a and an inductor 19b. The gate terminal 15c of the overvoltage protective circuit is connected through a resistor 20 and a blocking diode 21 to the juncture of the blocking diode 18 and the energy storing circuit 19. The blocking diode 18 ensures that the entire overvoltage protective circuit 15 will have a reverse blocking voltage capability exceeding that of the associated main thyristor. In the series overvoltage protective circuit 15 the auxiliary thyristors 17a, 17b, 17c and the blocking diode 18 are all poled to conduct current in the same direction as the paralleled main thyristor. As thus far described the overvoltage protective circuit 15 is described and claimed in our foregoing U.S. Pat. No. 3,662,250.

The aggregate forward breakover voltage of the series-connected auxiliary thyristors 17a, 17b, 17c is the sum of their individual forward voltage breakover characteristics, but their individual breakover voltages are not necessarily the same. If one such thyristor is omitted, or another added, the aggregate breakover characteristic of the series circuit is decreased, or increased, by a step in voltage magnitude equal to the breakover voltage characteristic of the omitted or added thyristor. Intermediate values of aggregate breakover voltage are not attainable solely by adding or subtracting thyristors in the series circuit.

In order to cause the series overvoltage protective circuit 15 to break down at a threshold voltage level intermediate the aggregate breakdown voltage of the three auxiliary thyristors 17a, 17b, 17c and the discretely smaller aggregate breakdown voltage of the thyristors 17b, 17c alone (i.e., as by omitting 17a), I provide a secondary voltage breakdown circuit shunted across all or part of one of the series connected auxiliary thyristors. In the embodiment of my invention shown at FIG. 2 this secondary breakdown circuit comprises a reversely poled blocking diode 30 connected in series circuit relation with a variable resistor 31 across the anode and cathode terminals of the auxiliary thyristor 17a, the diode 30 being poled to conduct forward current in a direction opposite to forward current through the auxiliary thyristors and main thyristor.

The blocking diode 30 is selected to break down in the reverse direction at a voltage less than the forward breakdown voltage characteristic of the auxiliary thyristor 17a. For example, assume that the desired threshold or breakdown voltage of the overvoltage protective circuit 15 is 2400 volts and that auxiliary thyristors are available only with breakdown voltages of 600 volts or 1500 volts. A 2400 volt breakdown series circuit could then be designed utilizing four 600 volt thyristors in series. However, in accordance with my invention the number of series thyristors may be reduced to three by utilizing for the thyristor 17a a single 1500 volt device and shunting it through a reversely disposed diode 30 having a reverse breakdown voltage characteristic of 1200 volts.

In operation of such a circuit the aggregate breakdown voltage characteristic of the series circuit is determined by the sum of the forward breakdown voltages of thyristors 17b and 17c and the reverse breakdown voltage characteristic of diode 30, i.e., an aggregate 2400 volts. When such breakdown occurs and current flows reversely through the diode 30 and in the forward direction through thyristors 17b, 17c, the voltage drop across the auxiliary thyristors 17b, 17c falls rapidly to a small value so that more than 1500 volts is applied across the auxiliary thyristor 17a. Thereupon the thyristor 17a breaks down and the voltage across it falls to a small value, so that reverse current through the diodes 30 ceases. With the series circuit through the thyristor 17a, 17b, 17c thus in conduction, a gating pulse is applied through the terminal 15c to the gate electrode of the main thyristor in the manner described in our prior U.S. Pat. No. 3,662,250.

The purpose and function of the series resistor 31 in the secondary breakdown circuit across auxiliary thyristor 17a will now be evident. This resistor is shown as variable. If it is adjusted to a substantially zero value, the blocking diode 30 will avalanche in reverse at its rated value, for example 1200 volts, and carry sufficient current to cause series thyristors 17b and 17c to switch on so long as voltage across it remains at the 1200 volt level. With an appreciable resistance 31 in series, however, there is required a voltage greater than 1200 volts across secondary breakdown circuit 30, 31 to maintain sufficient avalanche current through the diode 30. In this manner the effective breakdown voltage of the secondary breakdown circuit 30, 31 may be adjusted to values greater than 1200 volts (but of course less than the 1500 volts at which the device 17a would itself breakdown).

The foregoing action is illustrated at FIG. 3, wherein $I_s$ represents the current at which thyristors 17b and 17c will turn on, curve A represents the reverse breakdown voltage characteristic of the diode 30 with the resistor 31 equal to substantially zero, and curve B represents the voltage breakdown characteristic of the secondary breakdown circuit 30, 31 if the resistor 31 is of substantial value. It will be observed that curve A attains the switching current $I_s$ at substantially the diode breakdown voltage $V_1$ (i.e., 1200 volts) but that with a resistance 31 in series, such switching current is not attained on curve B until a voltage $V_3$ intermediate $V_1$ and the forward breakdown voltage $V_2$ of the auxiliary diode 17a. By varying the magnitude of the resistor 31, the magnitude of the intermediate voltage $V_3$ may be varied.

Referring now to FIG. 4, we have illustrated another embodiment of our invention wherein te auxiliary diode 17a is shunted by a secondary breakdown circuit which comprises a forwardly poled thyristor 30a in series with the variable resistor 31 and a fixed resistor 32, the thyristor 30a having a forward breakdown voltage less than that of the auxiliary thyristor 17a. In this case the fixed resistor 32 is necessary to ensure forward breakdown of the thyristor 17a after the thyristors 17b and 17c conduct.

At FIG. 5 we have illustrated another embodiment of our invention in which a secondary breakdown circuit including a forwardly poled thyristor 30a and a variable resistor 31 is connected across the anode to gate terminals of the auxiliary thyristor 17a. In this case conduction through the thyristor 30a provides a gate pulse to initiate conduction of the auxiliary thyristor 17a. If desired a secondary energy storage circuit comprising a capacitor 35 and an inductor 36 (shown in dotted lines) may be connected between the cathode of thyristor 30a and the cathode of auxiliary thyristor 17a, thereby to constitute an overvoltage breakdown circuit across thyristor 17a similar to the circuit 15 across the main thyristor.

At FIG. 6 we have illustrated still another embodiment of our invention wherein the secondary breakdown circuit across auxiliary thyristor 17a comprises a voltage breakdown device in the form of a non-linear resistor 40 having a steeply negative resistance-voltage characteristic. One suitable resistor of such a type is known as a metal oxide varistor and is described in U.S. Pat. No. 3,863,193—Matsuura. Another such resistor is known by the General Electric Company trademark Thyrite and is described in U.S. Pat. No. 3,291,759—Pitha.

It will now be evident to those skilled in the art that, while we have illustrated only certain preferred embodiments of our invention by way of illustration many modifications will occur to those skilled in the art. We therefore intend in the appended claims to cover all such modifications as fall within the true spirit and scope of our invention.

What we claim as new and desire to secure by Letters Patent of the United States is:

1. An overvoltage responsive triggering circuit for a main high power thyristor comprising: a plurality of $n$ auxiliary thyristors and an electric energy storing means connected in series circuit relation across said main thyristor, said auxiliary thyristors being poled to conduct forward current in the same direction as said main thyristor and having an aggregate forward breakdown voltage greater than an adjustable predetermined threshold magnitude, said threshold magnitude being greater than the aggregate forward breakdown voltage of said $n$ auxiliary thyristors minus the forward breakdown voltage of one of said auxiliary thyristors, and secondary voltage breakdown means connected between the anode and another electrode of said one auxiliary thyristor and having a blocking voltage less than the forward breakdown voltage of said one auxiliary thyristor, whereby said triggering circuit becomes conductive in the breakdown mode at said threshold voltage magnitude.

2. An overvoltage responsive triggering circuit according to claim 1 wherein said secondary voltage breakdown means shunts the anode to cathode circuit of said one auxiliary thyristor.

3. An overvoltage responsive triggering circuit according to claim 2 wherein said voltage breakdown means comprises a blocking diode oppositely poled with respect to said one auxiliary thyristor.

4. An overvoltage responsive triggering circuit according to claim 3 including a variable resistor in series circuit relation with said blocking diode between the anode and cathode of said one auxiliary thyristor.

5. An overvoltage responsive triggering circuit according to claim 2 wherein said voltage breakdown means comprises a resistor having a non-linear negative resistance-voltage characteristic.

6. An overvoltage responsive triggering circuit according to claim 1 wherein said secondary voltage breakdown means comprises a secondary thyristor connected in series circuit relation with a resistor between the anode and gate electrode of said one auxiliary thyristor.

7. An overvoltage responsive triggering circuit for a main high power thyristor comprising: a plurality of $n$ auxiliary thyristors and an electric energy storing means connected in series circuit relation across said main thyristor, said auxiliary thyristors being poled to conduct forward current in the same direction as said main thyristor and having an aggregate forward breakdown voltage greater than a predetermined threshold magnitude, said threshold magnitude being greater than the aggregate forward breakdown voltage of said $n$ auxiliary thyristors minus the forward breakdown voltage of one of said auxiliary thyristors, and secondary voltage breakdown means comprising a blocking diode oppositely poled with respect to said one auxiliary thyristor connected between the anode and cathode of said one auxiliary thyristor and having a blocking voltage less than the forward breakdown voltage of said one auxiliary thyristor, said voltage breakdown means including a variable resistor in series circuit relation with said blocking diode between the anode and cathode of said one auxiliary thyristor, whereby said triggering circuit becomes conductive in the breakdown mode at said threshold voltage magnitude.

8. An overvoltage responsive triggering circuit for a main high power thyristor comprising: a plurality of $n$ auxiliary thyristors and an electric energy storing means connected in series circuit relation across said main thyristor, said auxiliary thyristors being poled to conduct forward current in the same direction as said main thyristor and having an aggregate forward breakdown voltage greater than a predetermined threshold magnitude, said threshold magnitude being greater than the aggregate forward breakdown voltage of said $n$ auxiliary thyristors minus the forward breakdown voltage of one of said auxiliary thyristors, and secondary voltage breakdown means comprising a resistor having a non-linear negative resistance-voltage characteristic connected between the anode and cathode of said one auxiliary thyristor and having a blocking voltage less than the forward breakdown voltage of said one auxiliary thyristor, whereby said triggering circuit becomes conductive in the breakdown mode at said threshold voltage magnitude.

9. An overvoltage responsive triggering circuit for a main high power thyristor comprising: a plurality of $n$ auxiliary thyristors and an electric energy storing means connected in series circuit relation across said main thyristor, said auxiliary thyristors being poled to conduct forward current in the same direction as said main thyristor and having an aggregate forward breakdown voltage greater than a predetermined threshold magnitude, said threshold magnitude being greater than the aggregate forward breakdown voltage of said $n$ auxiliary thyristors minus the forward breakdown voltage of one of said auxiliary thyristors, and secondary voltage breakdown means connected between the anode and cathode of said one auxiliary thyristor and having a blocking voltage less than the forward breakdown voltage of said one auxiliary thyristor, said secondary voltage breakdown means including means for providing a forward breakdown voltage across said anode and cathode of said one auxiliary thyristor when said blocking voltage is obtained whereby said triggering circuit becomes conductive in the breakdown mode at said threshold voltage magnitude.

10. An overvoltage responsive triggering circuit in accordance with claim 9 in which said secondary voltage breakdown means comprises an oppositely poled blocking diode and a resistor in series circuit with said one auxiliary thyristor.

11. An overvoltage responsive triggering circuit in accordance with claim 10 in which said resistor comprises a variable resistor.

12. An overvoltage responsive triggering circuit in accordance with claim 9 in which said secondary voltage breakdown means comprises a resistor having a non-linear negative resistance-voltage characteristic.

13. An overvoltage responsive triggering circuit in accordance with claim 9 in which said secondary voltage breakdown means comprises a forwardly poled secondary thyristor connected in series circuit relation with a resistor.

14. An overvoltage responsive triggering circuit in accordance with claim 13 in which said resistor comprises a variable resistor.

* * * * *